United States Patent
Chen

(10) Patent No.: US 10,187,068 B2
(45) Date of Patent: Jan. 22, 2019

(54) PHASE ADJUSTMENT CIRCUIT, CONTROL METHOD, AND MEASUREMENT METHOD

(71) Applicant: Realtek Semiconductor Corporation, Hsinchu (TW)

(72) Inventor: Chien-Wen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/794,014

(22) Filed: Oct. 26, 2017

(65) Prior Publication Data

US 2018/0123599 A1   May 3, 2018

(30) Foreign Application Priority Data

Nov. 2, 2016 (TW) ............................. 105135562 A

(51) Int. Cl.
| | | |
|---|---|---|
| H03D 3/24 | (2006.01) | |
| H03L 7/089 | (2006.01) | |
| H04L 7/00 | (2006.01) | |
| H03K 3/013 | (2006.01) | |
| H03K 5/13 | (2014.01) | |
| H03K 5/131 | (2014.01) | |

(52) U.S. Cl.
CPC ............ *H03L 7/089* (2013.01); *H03K 3/013* (2013.01); *H03K 5/13* (2013.01); *H03K 5/131* (2013.01); *H04L 7/0025* (2013.01)

(58) Field of Classification Search
CPC ........ H04L 7/0025; H03K 3/013; H03L 7/089
USPC ........................................................ 375/375
See application file for complete search history.

(56) References Cited

U.S. PATENT DOCUMENTS

| | | | | |
|---|---|---|---|---|
| 7,772,907 B2 * | 8/2010 | Kim | ..................... | H03L 7/0814 327/231 |
| 8,081,024 B1 * | 12/2011 | Evans | ..................... | H03K 5/13 327/175 |

(Continued)

FOREIGN PATENT DOCUMENTS

TW    I420818 B    12/2013

OTHER PUBLICATIONS

Daniel K. Weinlader, "Precision CMOS Receivers for VLSI Testing Applications," Ph.D. Dissertation, Stanford University, Nov. 2001.

(Continued)

*Primary Examiner* — Helene E Tayong
(74) *Attorney, Agent, or Firm* — CKC & Partners Co., Ltd.

(57) ABSTRACT

A control method, which is adapted to a phase interpolator configured to generate an output signal based on a current distribution ratio, includes following operations: selecting a first input pair and a second input pair from the phase interpolator; sequentially switching currents associated with the current distribution ratio from the first input pair to flowing through the second input pair, in order to adjust a phase of the output signal to correspond to a first phase interval; and after all of the currents flow through to the second input pair, selecting the second input pair and a third input pair from the phase interpolator, and adjusting the current distribution ratio to correspond the phase of the output signal to a second phase interval, in which the first phase interval and the second phase interval are continuous.

18 Claims, 6 Drawing Sheets

(56) References Cited

U.S. PATENT DOCUMENTS

| | | | | |
|---|---|---|---|---|
| 8,248,138 B2* | 8/2012 | Liu | ................... | H03K 5/13 |
| | | | | 327/149 |
| 2012/0182059 A1* | 7/2012 | Kwak | ................ | G11C 7/1072 |
| | | | | 327/299 |
| 2015/0358008 A1* | 12/2015 | Sun | ................... | H03K 5/13 |
| | | | | 327/231 |
| 2015/0358148 A1* | 12/2015 | Sun | ................ | H04L 7/0331 |
| | | | | 375/376 |

OTHER PUBLICATIONS

Stefanos Sidiropoulos et al., "Adaptive bandwidth DLLs and PLLs using regulated supply CMOS buffers," Symposium on VLSI Circuits Digest of Technical Papers, IEEE 2000.

Pier Andrea Francese et al., "A 16 Gb/s 3.7 mW/Gb/s 8-Tap DFE Receiver and Baud-Rate CDR With 31 kppm Tracking Bandwidth," IEEE Journal of Solid-State Circuits, vol. 49, No. 11, Nov. 2014.

* cited by examiner

… … …

PHASE ADJUSTMENT CIRCUIT, CONTROL METHOD, AND MEASUREMENT METHOD

RELATED APPLICATIONS

This application claims priority to Taiwan Application Serial Number, 105135562, Nov. 2, 2016, which is herein incorporated by reference.

BACKGROUND

Technical Field

The present disclosure relates to an integrated circuit. More particularly, the present disclosure relates to a phase rotator, a control method thereof, and a measurement method for a phase interpolator.

Description of Related Art

In current approaches, a phase interpolator is commonly configured to determine a phase of an output signal according at least one clock signal and a current distribution ratio which is usually determined by switches. However, in such the approaches, during the switching progress of the switches, instant unstable phase-shift is introduced to a rising edge or a falling edge of the output signal. The smoothness and the accuracy of the phase modulation for the output signal are thus reduced. In addition, when the periods between switching the phase of the output signal are too small, changes in the phase of the output signal would be difficult to be measured due to the instant unstable phase-shift.

SUMMARY

An example embodiment of a control method adapted to a phase interpolator configured to generate an output signal based on a current distribution ratio is disclosed, including: selecting a first input pair and a second input pair from the phase interpolator; sequentially switching a plurality of currents associated with the current distribution ratio from flowing through the first input pair to flowing through the second input pair, in order to adjust a phase of the output signal to correspond to a first phase interval; and after all of the plurality of currents flow through to the second input pair, selecting the second input pair and a third input pair from the phase interpolator, and adjusting the current distribution ratio to correspond the phase of the output signal to a second phase interval, in which the first phase interval and the second phase interval are continuous.

DETAILED DESCRIPTION

Figure 1A:
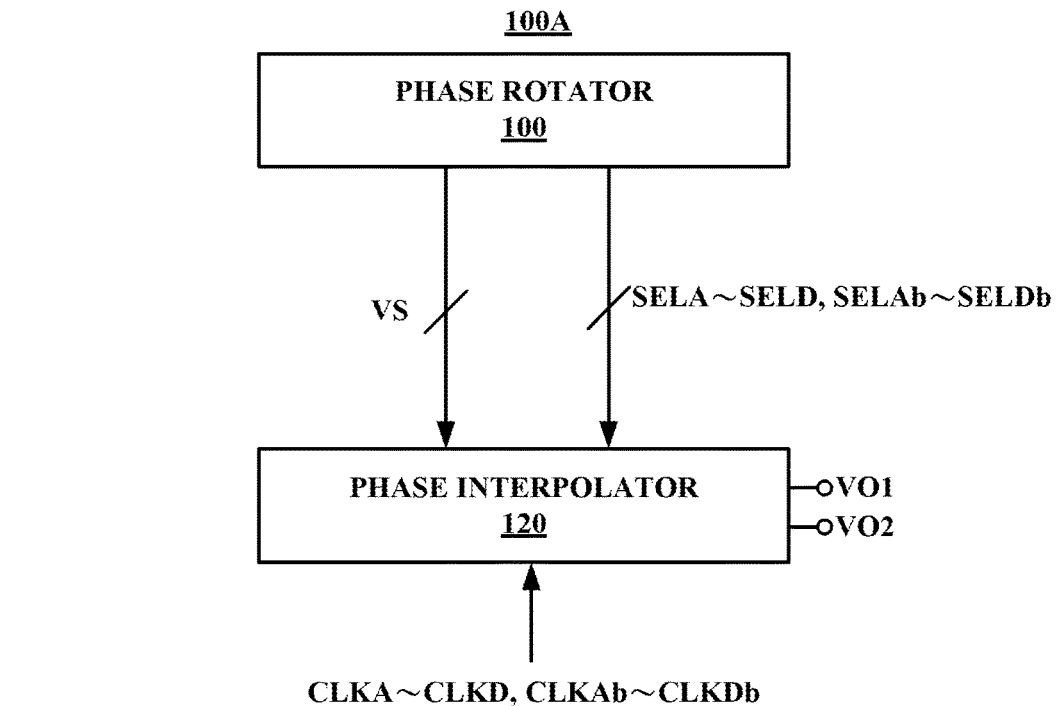
FIG. 1A is a schematic diagram of a phase adjustment circuit according to some embodiments.

Reference is made to FIG. 1A. A phase adjustment circuit 100A includes a phase rotator 100 and a phase interpolator 120. The phase interpolator 120 is coupled to the phase rotator 100 to receive selection signals SELA-SELD and SELAb-SELDb and a switching signal VS. The phase interpolator 120 generates an output signal VO1 and an output signal VO2 according to groups of clock signals (CLKA, CLKAb)–(CLKD, CLKDb), in which a phase difference in each group of clock signals (CLKA, CLKAb)–(CLKD CLKDb) are about 180 degrees. For example, the clock signal CLKA and the clock signal CLKAb are different in phase by about 180 degrees.

In some embodiments, the phase interpolator 120 adjusts a phase of the output signal VO1 and a phase of the output signal VO2 according to the selection signals SELA-SELD and SELAb-SELDb and the switching signal VS. In some embodiments, the selection signals SELA-SELD and SELAb-SELDb are binary codes.

Figure 1B:
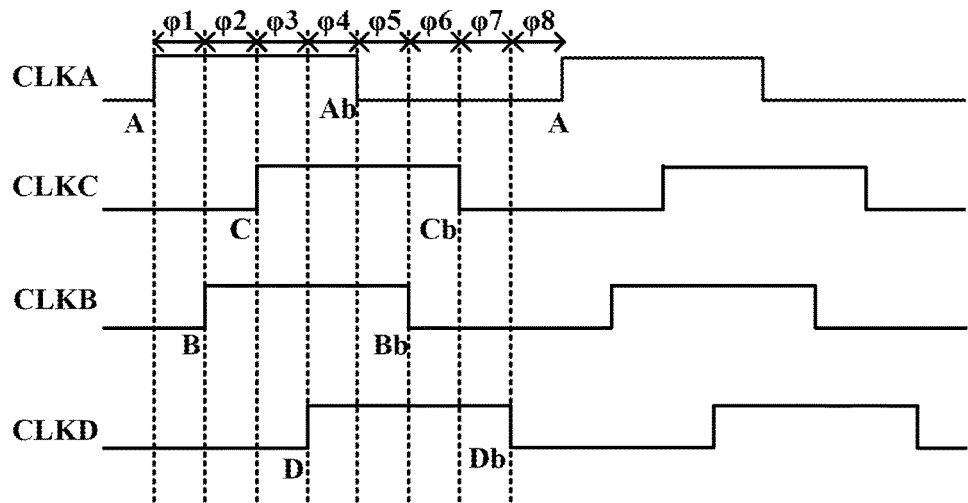
FIG. 1B is a schematic diagram illustrating clock signals in FIG. 1A, according to some embodiments.

Reference is made to FIG. 1B. In some embodiments, phases of the clock signals CLKA-CLKD are spaced apart with each other by a phase difference, in order to define continuous phase intervals $\phi1$–$\phi8$.

For example, as shown in FIG. 1B, the phase interval $\phi1$ is present between a rising edge A of the clock signal CLKA and a rising edge B of the clock signal CLKB. The phase interval $\phi2$ is present between the rising edge B of the clock signal CLKB and a rising edge C of the clock signal CLKC. The phase interval $\phi3$ is present between the rising edge C of the clock signal CLKC and a rising edge D of the clock signal CLKD. The phase interval $\phi4$ is present between the rising edge D of the clock signal CLKD and a falling edge Ab of the clock signal CLKA.

The phase interval $\phi5$ is present between the falling edge Ab of the clock signal CLKA and a falling edge Bb of the clock signal CLKB. The phase interval $\phi6$ is present between the falling edge Bb of the clock signal CLKB and a falling edge Cb of the clock signal CLKC. The phase interval $\phi7$ is present between the falling edge Cb of the clock signal CLKC and a falling edge Db of the clock signal CLKD. The phase interval $\phi8$ is present between the falling edge Db of the clock signal CLKD and the rising edge A of the clock signal CLKA.

In some embodiments, the phase interpolator 120 adjusts the phases of the output signals VO1 and VO2 to a corresponding one of the phase intervals $\phi1$–$\phi8$. The related operations will be described with reference to FIG. 2 below.

Figure 1C:
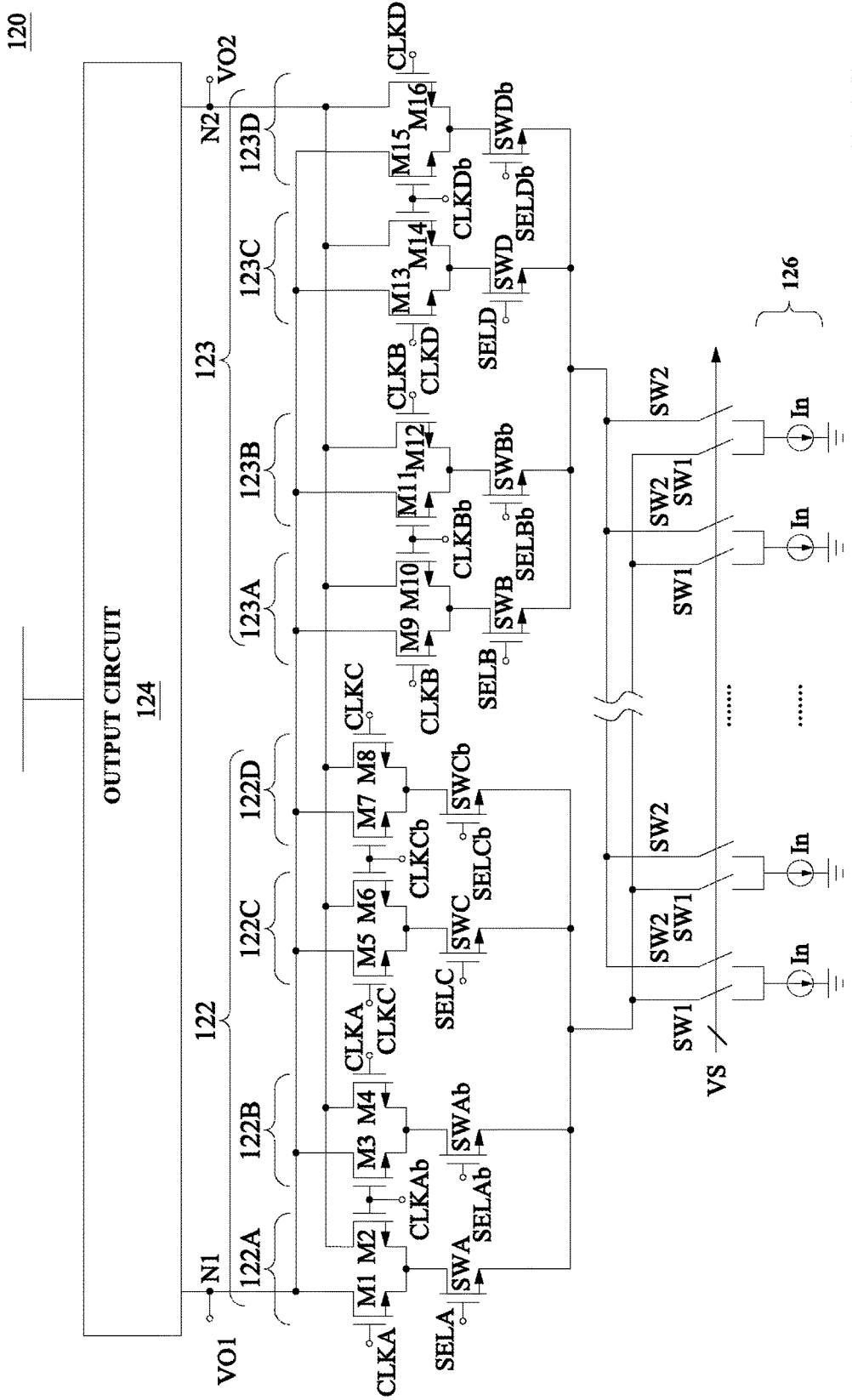
FIG. 1C is a circuit diagram illustrating the phase interpolator in FIG. 1A, according to some embodiments.

Reference is made to FIG. 1C. In some embodiments, the phase interpolator 120 includes input circuits 122-123, an output circuit 124, switches SWA-SWD, SWAb-SWDb, and SW1-SW2, and a current source circuit 126.

The input circuit 122 includes input pairs 122A-122D that correspond to two groups of clock signals (CLKA, CLKAb) and (CLKC, CLKCb).

In some embodiments, the input pair 122A includes transistors M1 and M2. A first terminal of the transistor M1 is coupled to a first terminal N1 of the output circuit 124, a second terminal of the transistor M1 is coupled to a first terminal of the switch SWA, and a control terminal of the transistor M1 receives the clock signal CLKA. A first terminal of the transistor M2 is coupled to a second terminal N2 of the output circuit 124, a second terminal of the transistor M2 is coupled to the first terminal of the switch SWA, and a control terminal of the transistor M2 receives the clock signal CLKAb.

In some embodiments, the input pair 122B includes transistors M3-M4. A first terminal of the transistor M3 is coupled to the first terminal N1 of the output circuit 124, a second terminal of the transistor M3 is coupled to a first terminal of the switch SWAb, and a control terminal of the transistor M3 receives the clock signal CLKAb. A first terminal of the transistor M4 is coupled to the second terminal N2 of the output circuit 124, a second terminal of the transistor M4 is coupled to the first terminal of the switch SWAb, and a control terminal of the transistor M4 receives the clock signal CLKA.

A second terminal of the switch SWA is coupled to first terminals of the switches SW1, and a control terminal of the switch SWA receives the selection signal SELA. The switch SWA is configured to be turned on according to the selection signal SELA, such that currents In, which are generated from the current source circuit 126, flow through the input pair 122A. A second terminal of the switch SWAb is coupled to first terminals of the switches SW1, and a control terminal of the switch SWAb receives the selection signal SELAb. The switch SWAb is configured to be turned on according to the selection signal SELAb, such that the currents In, which are generated from the current source circuit 126, flow through the input pair 122B.

In some embodiments, the input pair 122C includes transistors M5-M6, and the input pair 122D includes transistors M7-M8. The arrangements of the transistors M5-M8, the switches SWC and SWCb, the selection signals SELC and SELCb, and the current source circuit 126 are similar with the arrangements of the input pairs 122A-122B discussed above, and thus the repetitious descriptions are not given herein.

In some embodiments, the input circuit 123 includes input pairs 123A-123D, and is configured to correspond to two groups of clock signals (CLKB, CLKBb) and (CLKD, CLKDb).

In some embodiments, the input pair 123A includes transistors M9-M10, the input pair 123B includes transistors M11-M12, the input pair 123C includes transistors M13-M14, and the input pair 123D includes transistors M15-M16. The arrangements of the transistors M9-M16, the switches SWB, SWBb, SWD, and SWDb, the selection signals SELB, SELBb, SELD, and SELDb, and the current source circuit 126 are similar with the arrangements of the input circuit 122 discussed above. Thus, the repetitious descriptions are not given herein.

In some embodiments, the output circuit 124 operates as a load. A first terminal N1 of the output circuit 124 is configured to generate the output signal V01, and a second terminal N2 of the output circuit 124 is configured to generate the output signal VO2. In some embodiments, the output circuit 124 is configured to provide at least one active load to the input circuit 122 and the input circuit 123. The current source circuit 126 includes current sources for generating the currents In respectively. In some embodiments, the current sources may be implemented with one or more current mirror circuits.

Second terminals of the switches SW1 and second terminals of the switches SW2 are coupled to the current sources of the current source circuit 126, respectively. Control terminals of the switches SW1 and SW2 receive signal values of the switching signal VS, respectively, in order to be selectively turned on according to the signal values of the switching signals VS. For example, when the signal values of the switching signal VS are logic values of 0, the switches SW1 are turned on, and the switches SW2 are turned off. Accordingly, all of the currents In flow through the input circuit 122. Alternatively, when the signal values of the switching signal VS are logic value of 1, the switches SW2 are turned on, and the switches SW1 are turned off. Accordingly, all of the currents In flow through the input circuit 123. It is noted that, all of the currents In are described to be flowing through the input circuit 122 or the input circuit 123 in the embodiments, but the present disclosure is not limited thereto. For example, in some other embodiments, it can be designed as part of the currents In flowing through the input circuit 122 or the input circuit 123. In some embodiments, the switches SW1 and SW2 are configured to determine a distribution ratio of the current flowing through the input pairs 122A-122D and 123A-123D.

With such arrangements, the phase interpolator 120 may adjust the phases of the output signals VO1 and VO2 according to the selection signals SELA-SELD and SELAb-SELDb and the aforementioned current distribution ratio. For example, when the selection signals SELA and SELB are logic values of 1, it indicates that the input pairs 122A and 123A are selected, and the phase interpolator 120 adjusts the phases of the output signals VO1 and VO2 to the phase interval $\phi 1$.

The arrangements of the phase interpolator 120 are given for illustrative purposes only. Various types of the phase interpolator 120 are within the contemplated scope of the present disclosure.

Figure 2:
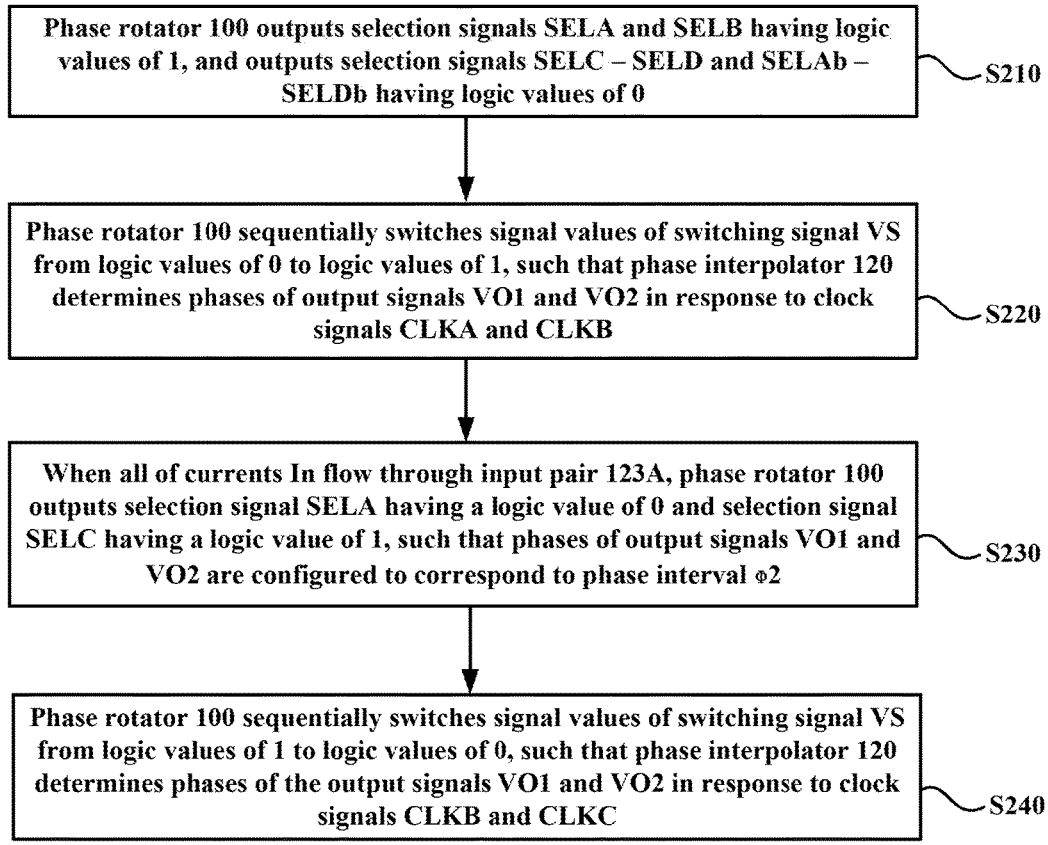
FIG. 2 is a flow chart of a control method, according to some embodiments.
Figure 3:
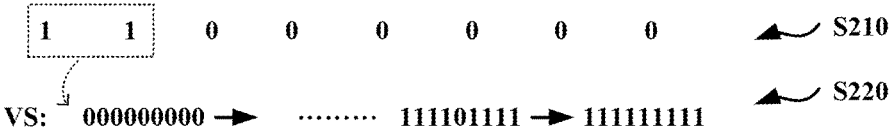
FIG. 3 is a schematic diagram of a phase adjustment circuit according to some embodiments.
Figure 3:
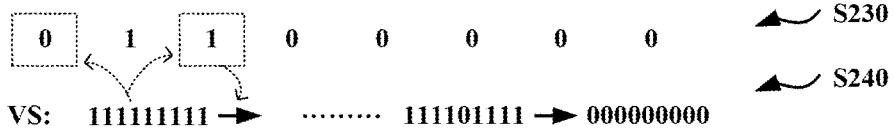

Reference is now made to FIG. 2 and FIG. 3. Operations of the phase rotator 100 in FIG. 1A are described with reference to a control method 200 of FIG. 2 and signal statuses of FIG. 3. In some embodiments, the control method includes operations S210, S220, S230, and S240.

In operation S210, the phase rotator 100 outputs the selection signals SELA and SELB having logic values of 1, and outputs the selection signals SELC-SELD and SELAb-SELDb having logic values of 0. Under this condition, the switches SWA and SWB are turned on, and the switches SWC, SWD, and SWAb-SWDb are turned off. Accordingly, the input pairs 122A and 123A are selected, and an initial interval of the output signals VO1 and VO2 is determined to be the phase interval $\phi 1$.

In operation S220, the phase rotator 100 sequentially switches the signal values of the switching signal VS from logic values of 0 to logic values of 1, such that the phase interpolator 120 determines the phases of the output signals VO1 and VO2 in response to the clock signals CLKA and CLKB.

Taking FIG. 1C as an example, as discussed above, when the signal value of the switching signal VS is a logic value of 0, a corresponding switch SW1 is turned on, and a corresponding switch SW2 is turned off. Alternatively, when the signal value of the switching signal VS is a logic value of 1, the corresponding switch SW1 is turned off, and the corresponding switch SW2 is turned on. When the signal values of the switching signal VS are all logic values of 0, all of the switches SW1 are turned on, and all of the switches SW2 are turned off. Under this condition, all of the currents In flow through the input pair 122A via the turn-on switches SW1. Accordingly, the phases of the output signals VO1 and VO2 are adjusted to substantially correspond to the phase of the clock signal CLKA. When the signal values of the switching signal VS are sequentially switched from logic values of 0 to logic values of 1, the switches SW1 are sequentially turned off, and the switches SW2 are sequentially turned on. Under this condition, the currents In are sequentially adjusted to flow through the input pair 123A via the switches SWB. Accordingly, the phases of the output signals VO1 and VO2 are adjusted to toward the phase of the clock signal CLKB. When all of the switches SW2 are turned on and all of the switches SW1 are turned off, all of the currents In flow through the input pair 123A. Under this condition, the phases of the output signals VO1 and VO2 are adjusted to substantially correspond to the phase of the clock signal CLKB.

Effectively, by performing operations S210 and S220, the phase interpolator 120 determines the phases of the output signals VO1-VO2, according to different current distribution ratios, in the phase interval $\phi 1$.

With continued reference to FIG. 2, in operation S230, when all of the currents In flow through the input pair 123A, the phase rotator 100 outputs the selection signal SELA having a logic value of 0 and the selection signal SELC having a logic value of 1, such that the phases of the output signals VO1 and VO2 are configured to correspond to the phase interval $\phi 2$. In operation S240, the phase rotator 100 sequentially switches the signal values of the switching signal VS from logic values of 1 to logic values of 0, such that the phase interpolator 120 determines the phases of the output signals VO1 and VO2 in response to the clock signals CLKB and CLKC.

For illustration, as shown in FIG. 3, when the phase interval $\phi 1$ is switched to the phase interval $\phi 2$, the signal values of the switching signal VS are kept being as logic values of 1. As a result, all of the currents In continuously flow through the input circuit 123. Then, the phase rotator 100 outputs the selection signal SELC having logic value of 1, in order to turn on the switch SWC. Meanwhile, the phase rotator 100 outputs the selection signal SELA having logic value of 0, in order to turn off the switch SWA. Next, the phase rotator 100 switches the signal values of the switching signal VS from logic values of 1 to logic values of 0. Under this condition, the currents In are sequentially switched to flow through the input pair 122C via the turn-on switch SWC. Accordingly, the phases of the output signals VO1 and VO2 are adjusted to toward the phase of the clock signal CLKC. When all of the switches SW1 are turned on and all of the switches SW2 are turned off, all of the currents In flow through the input pair 122C. Under this condition, the phases of the output signals VO1 and VO2 are adjusted to substantially correspond to the phase of the clock signal CLKC. With the above operations, effectively, the phase rotator 100 determines the phases of the output signals VO1-VO2, according to different current distribution ratios, in the phase interval $\phi 2$.

In some related approaches, when the phase of the output signal is rotated, the phase interpolator is configured to turn switches, which control the current distribution ratio, on or off while selecting a corresponding input pair. As a result, during the progress of turning the switches on or off, the currents (e.g., current In) associated with the current distribution ratio flow through un-selected input pairs, thereby introducing an instant unstable phase-shift to a rising edge or a falling edge of the output signal. Accordingly, a smoothness of transiting between edges of the output signal is reduced.

Compared with the related approaches, with operations of the control method 200, when the phase of the output signal VO1 or VO2 is to be rotated between different definition regions, the phase interpolator 120 is able to turn on a corresponding one of the switches SELA-SELD or SELAb-SEDb after the switching statuses of the switches SW1 and SW2 are determined, in order to select a correspond one of the input pairs 122A-122D or 123A-123D for switching the phase interval. As a result, the impacts, which are introduced from instant unstable phase-shift during the switching of the switches and the phase intervals, on the rising edge or falling edge of the output signals VO1 and VO2 are reduced, and the smoothness of the output signals VO1 and VO2 during the phase switching are thus improved.

The above examples illustrating with the continuous phase intervals $\phi 1$ and $\phi 2$ are given for illustrative purposes only, but the present disclosure is not limited thereto. The above operations are also applied to the phase intervals $\phi 2-\phi 8$, and thus the repetitious descriptions are not further given herein.

In some embodiments, in order to increase the speed of switching the phases, the phase rotator 10 is configured to switch the signal values of the switching signal VS according to a first switching step size in the above operation S220. In some embodiments, the term "switching step size" indicates a quantity of a digital code that is transited in the signal values of the switching signal VS at each switching. For example, as shown in FIG. 3, in some embodiments, the signal values of the switching signal VS are encoded with thermometer code, and the first switching step size is 32. As shown in FIG. 3, as the first step size is 32, before all signal values are switched to be logic values of 1, the signal values of the switching signals VS are "111101111."

In some other embodiments, the phase rotator 100 is configured to switch the signal values of the switching signal VS according to a second switching step size in batches, and the second switching step size is less than the first switching step size. In above examples, the second switching step size may be 16, and the phase rotator 100 is able to switch the signal values of the switching signal VS in two batches. Compared with using a larger switching step size, by using a smaller switching step size, the impacts, which are introduced from the instant unstable phase-shift or jitter signal components during the switching of the switches, on the rising edge or falling edge of the output signals VO1 and VO2 can be reduced. As a result, the smoothness of switching phases of the output signals VO1 and VO2 are able to be further improved.

The above encoding and values of the signal values of the switching signal VS and the switching step sizes are given for illustrative purposes only. Various types of encoding and various values of the switching step sizes are within the contemplated scope of the present disclosure. In addition, in some embodiments, with configurations of different switching step sizes, it is able to stay at the switching signal VS having a specific code for a time during the adjustment of the output signals VO1 and VO2, in order to reduce instant unstable phase-shift introduced from the switching of switches.

In some embodiments, the phase rotator 100 may be implemented with one or more integrated circuits that perform the control method 200. For example, the control method 200 may be implemented with a state machine, and the phase rotator 100 may be implemented with at least one digital circuit that corresponds to the state machine. In some other embodiments, the phase rotator 100 is able to be implemented with a processing unit that performs the method 200. In various embodiments, the processing unit may be a central processing unit, a micro-controller, a microprocessor, a digital signal processor, an application-specific integrated circuit or a logic circuit. The above implementations are given for illustrative purposes only, and various phase rotators 100 able to perform the control method 200 are within the contemplated scope of the present disclosure.

Figure 4A:
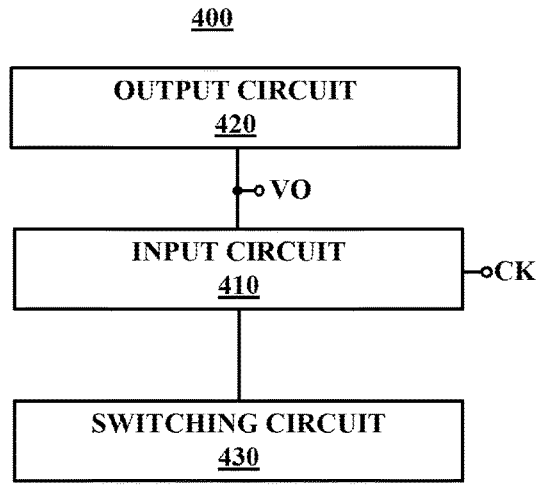
FIG. 4A is a schematic diagram illustrating a switching progress of the selection signals and the signal values of the switching signal in FIG. 1C, according to some embodiments.

Reference is now made to FIG. 4A. A phase interpolator 400 includes an input circuit 410, an output circuit 420, and a switching circuit 430. In some embodiments, the input circuit 410 includes at least one input pair that is configured to generate an output signal VO (e.g., output signals VO1 and VO2 in FIG. 1C) in response to a current distribution ratio and at least one clock signal CK (e.g., CLKA-CLKD in FIG. 1C). In some embodiments, the arrangements of the input circuit 410 are similar with the input circuits 122-123 in FIG. 1C. The output circuit 420 is coupled to the input circuit 410, and is configured to cooperate with the input circuit 410 to generate the output signal VO. In some embodiments, the arrangements of the output circuit 420 are similar with the output circuit 124 in FIG. 1C.

The switching circuit 430 is coupled between the input circuit 410 and a current source circuit 440, and is configured to determine the current distribution ratio. In some embodiments, the arrangements of the switching circuit 430 are similar with the switches SW1-SW2 and the current source circuit 126 in FIG. 1C. For example, as described above, when a number of the signal values, which are logic values of 1, of the switching signal VS in FIG. 1C is greater, a number of the currents In that flow through the input circuit 122 is greater. Alternatively, when a number of the signal values, which are logic values of 0, of the switching signal VS in FIG. 1C is less, the number of the currents In that flow through the input circuit 122 is less. In other words, the current distribution ratio can be determined by the signal values of the switching signals VS. In further embodiments, the switching circuit 430 further includes switches (e.g., switches SWA-SWD and SWAb-SWDb in FIG. 1C) that are configured to select a corresponding phase interval.

As described above, during the switches of the phase interpolator being switched back and forth, jitter is introduced to the rising or falling edge of the output signal. In other words, in some embodiments, it is able to generate jitter signal components to the output signal generated by the phase interpolator 400 by controlling conducting statuses of the switches in the switching circuit 430.

Figure 4B:
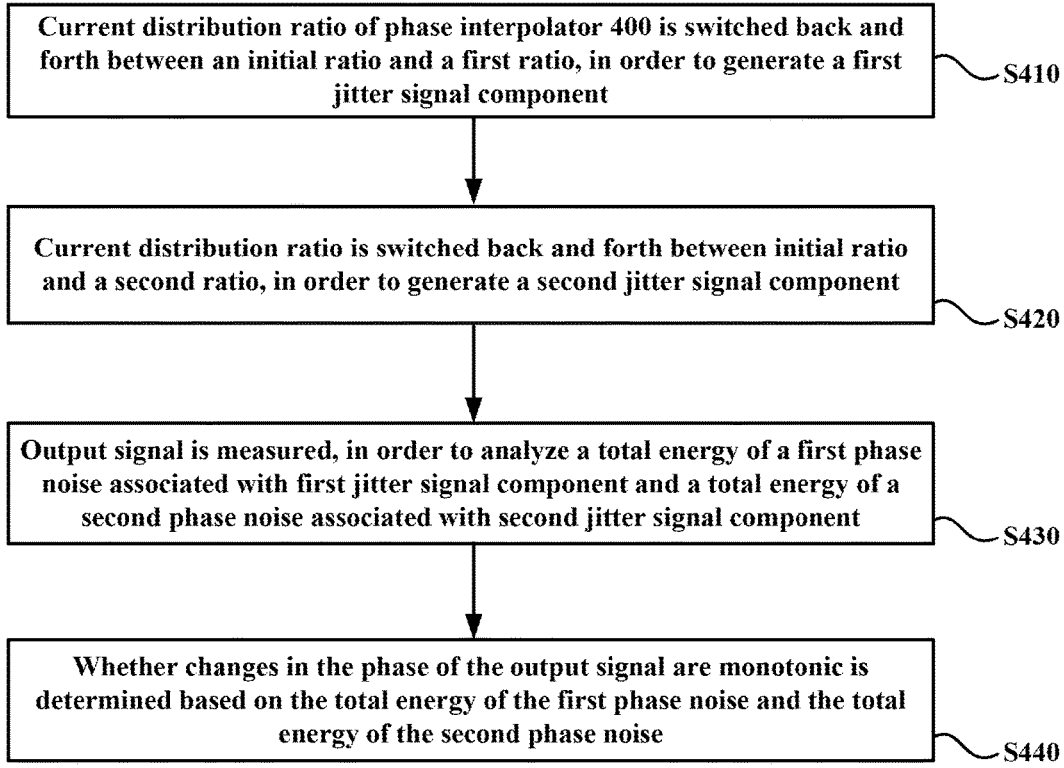
FIG. 4B is a flow chart of a measurement method for measuring the phase interpolator in FIG. 4A, according to some embodiments.

Reference is now made to FIG. 4B. A measurement method 400A includes operations S410, S420, S430, and S440.

In operation S410, the current distribution ratio of the phase interpolator 400 is switched back and forth between an initial ratio and a first ratio, in order to generate a first jitter signal component.

In operation S420, the current distribution ratio is switched back and forth between the initial ratio and a second ratio, in order to generate a second jitter signal component.

In operation S430, the output signal is measured, in order to analyze a total energy of a first phase noise associated with the first jitter signal component and a total energy of a second phase noise associated with the second jitter signal component.

In operation S440, whether changes in the phase of the output signal are monotonic is determined based on the total energy of the first phase noise and the total energy of the second phase noise.

As discussed above, during the switches of the phase interpolator are simultaneously switched back and forth, jitter is introduced to the rising or falling edge of the output signal. In other words, in some embodiments, a monotonicity of phase changes of the output signal can be measured by generating jitter signal components to the output signal. In some embodiments, the measurement method 400A may be used to measure the phase changes of the phase interpolator 400 in a single phase interval. In some other embodiments, the measurement method 400A may be used to measure the phase changes of the phase interpolator 400 in different phase intervals.

Figure 5A:
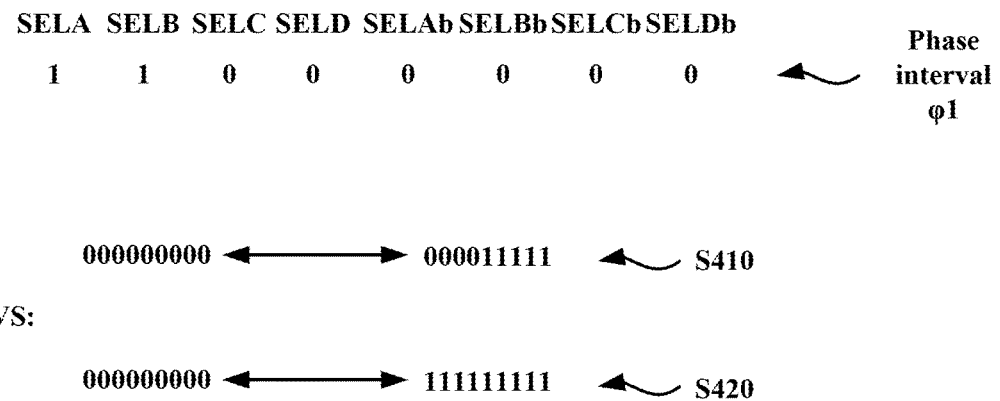
FIG. 5A is a schematic diagram illustrating a switching progress of the selection signals and the signal values of the switching signal in FIG. 1C under operations of the method in FIG. 4B, according to some embodiments.

For ease of understanding, the following descriptions are given with reference to the phase interpolator 400, the specific circuit example in FIG. 1C, and FIG. 5A to illustrate operations of the measurement method 400A. In the example of FIG. 5A, the selection signals SELA and SELB are logic values of 1, and the other selection signals SELC, SELD, and SELAb-SELDb are logic values of 0. Accordingly, the phases of the output signals VO1-VO2 are corresponding to the single phase interval $\phi 1$. As described above, the current distribution ratio can be determined by the signal values of the switching signal VS. In this example, the initial ratio of the current distribution ratio corresponds to the signal values "000000000" of the switching signal VS (which may be referred to as initial values of the switching signals VS), and the first ratio corresponds to the signal values "000011111" of the switching signal VS (which may be referred to as first signal values of the switching signals VS). Therefore, in operation S410, the signal values of the switching signal VS is switched back and forth between "000000000" and "000011111", in order to generate the first jitter signal component to the output signals VO1-VO2.

Similarly, in this example, the second ratio of the current distribution ratio corresponds to the signal values "111111111" of the switching signal VS (which may be referred to as the second signal values of the switching signal VS). In operation S420, the signal values of the switching signal VS is switched back and forth between "000000000" and "111111111", in order to generate the second jitter signal component to the output signals VO1-VO2.

Figure 5B:
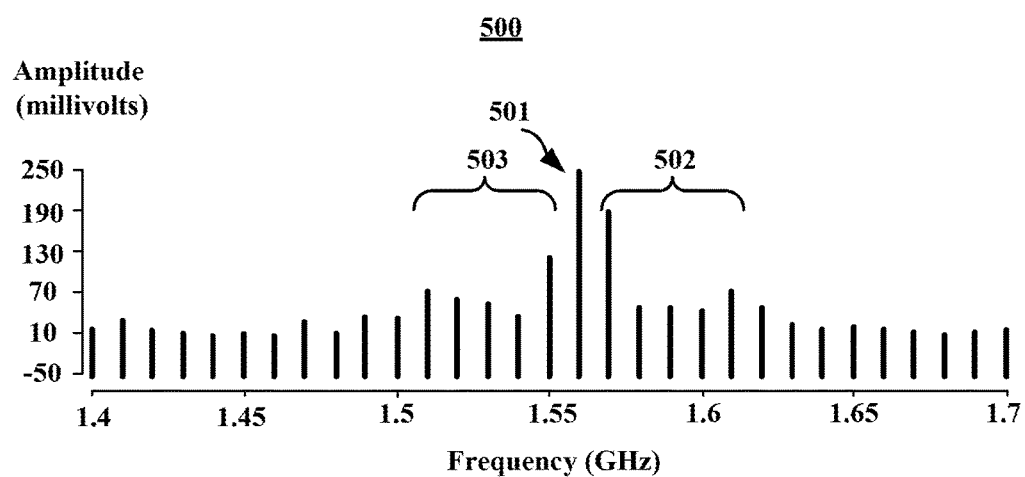
FIG. 5B is a schematic diagram illustrating a spectrum measured with the switching mode in FIG. 5A, according to some embodiments.

Reference is made to FIG. 5B. FIG. 5B is a schematic diagram illustrating a spectrum of the output signal VO1 and/or VO2 generated, by the phase interpolator 120, based on operations in FIG. 5A. By using a spectrum analysis, it is able to obtain energy distribution of the first jitter signal component and that of the second jitter signal component. For example, in some embodiments, amplitude values of a main tone 501 and its sidebands 502-503 are summed up to observe the total energy of the first phase noise which is associated with the first jitter signal component. In some embodiments, the total energy of the phase noise is referred to as a ratio of a sum of powers of signals having harmonic frequencies and noises in sidebands within a predetermined bandwidth and the power of the main tone. In some embodiments, the ranges of the predetermined bandwidth and the sidebands can be adjusted according to practical requirements.

In some embodiments, when the total energy of the phase noise associated with the second jitter signal component (hereinafter referred to as "second total energy") is greater than the total energy of the phase noise associated with the first jitter signal component (hereinafter referred to as "first total energy"), it is determined that the phase changes in the output signals VO1-VO2 are monotonic. In the example of FIG. 1C, a number of the switches SW1-SW2 that are switched in operation S420 is greater than a number of the switches SW1-SW2 that are switched in operation S410. Therefore, if the phase change of the output signals VO1-VO2 is monotonic, the second total energy may be theoretically greater than the first total energy. Accordingly, with the analysis from the spectrum in FIG. 5B, it is able to measure the first total energy and the second total energy, in order to determine whether the phase adjustment between the first ratio and the second ratio in the single phase interval $\phi1$ for the output signals VO1-VO2 is monotonic.

Figure 5C:
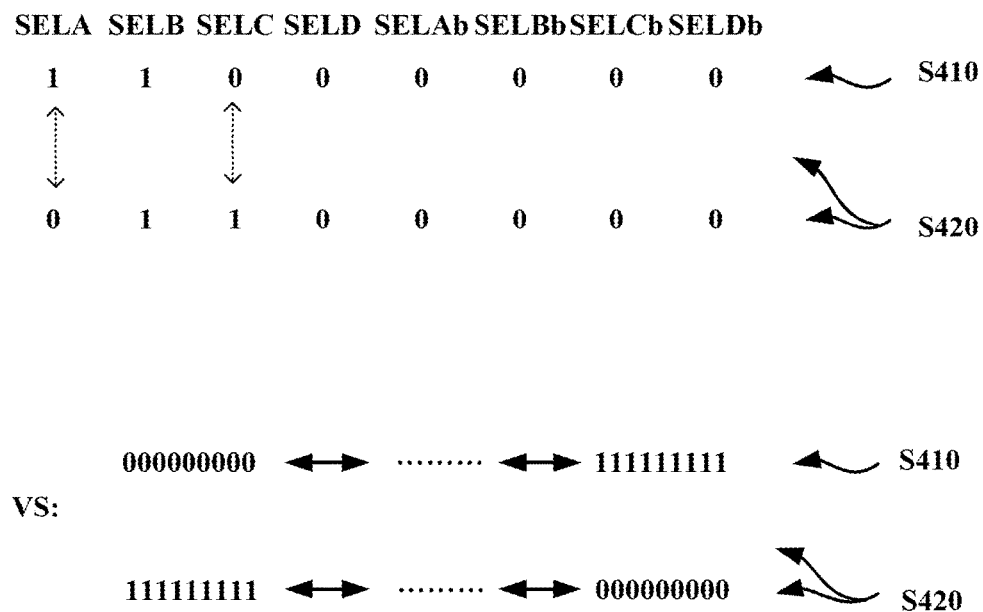
FIG. 5C is a schematic diagram illustrating a switching progress of the selection signals and the signal values of the switching signal in FIG. 1C under operations of the method in FIG. 4B, according to some other embodiments.

In some other embodiments, the measurement method 400A may be applied to measure the phase changes of the phase interpolator 400 in different phase intervals. For ease of understanding, the following descriptions are given with reference to the phase interpolator 400, the specific circuit example in FIG. 1C, and FIG. 5C to illustrate operations of the measurement method 400A. In the example of FIG. 5C, the selection signals SELA and SELB are switched to be logic values of 1 (which correspond to the phase interval $\phi1$), Meanwhile, the signal values of the switching signal VS are sequentially switched back and forth between logic values of 0 (i.e., the initial ratio) and logic values of 1 (i.e., the first ratio). Effectively, in operation S410, the phases of the output signals VO1-VO2 are continuously adjusted, in order to generate a corresponding first jitter signal component.

In operation S420, the selection signals SELA and SELB are switched to be logic values of 1 (which correspond to the phase interval $\phi1$). When corresponding to the phase interval $\phi1$, the signal values of the switching signal VS are switched from logic values of 0 to logic values of 1. Then, the selection signal SELA is further switched to be a logic value of 0, and the selection signal SELC is switched to be a logic value of 1 (which correspond to the phase interval $\phi2$). When corresponding to the phase interval $\phi2$, the signal values of the switching signal VS are switched from logic values of 1 to logic values of 0 (i.e., the second ratio). Effectively, in operation S420, the phases of the output signals VO1-VO2 are continuously adjusted in the phase intervals $\phi1$ (VS is logic value 0)-$\phi2$ (VS is logic value 1) back and forth, in order to generate a corresponding second jitter signal component. With this switching sequence to cross boundary phase, the phase interpolator 400 will have lower jitter which is caused by instant unstable timing shift.

In some embodiments, if the phase changes of the phase interpolator 120 in the different phase intervals are monotonic, the total energy of the jitter signal component are in direct proportional to the number of the phase intervals. For example, as the second jitter signal component corresponds to the phase intervals $\phi1$-$\phi2$, and the first jitter signal component only corresponds to the phase interval $\phi1$, the second total energy may be greater than the first total energy. With the spectrum analysis similar to FIG. 5B, when the second total energy is greater than the first total energy, it is able to determine that the phase changes of the output signals VO1-VO2 during the phase interpolator 120 operates in the phase intervals $\phi1$-$\phi2$ are monotonic. Alternatively, when the second total energy is less than the first total energy, it is able to determine that the phase changes made by the phase interpolator 120 are non-monotonic. By repeatedly performing the operations discussed above, it is able to determine whether the changes in phases made by the phase interpolator 120 operating in the phase intervals $\phi1$-$\phi8$ are monotonic.

For illustrative purposes only, the above descriptions for illustrating operations of the measurement method 400A are given with reference to the specific circuit example in FIG. 1C, but the present disclosure is not limited thereto. Various circuits to implement the phase interpolator 400 in FIG. 4A are able to be tested by the measurement method 400A.

As discussed above, the phase rotator and the control method thereof provided in the present disclosure can reduce the impacts, which are introduced from pluses during the phase rotation, on the output signals of the phase interpolator, in order to increase an accuracy of the output signals of the phase interpolator. On the other hand, the measurement method provided in the present disclosure can utilizes multiple switching modes to introduce jitter signal components via the pulses, in order to measure a monotonicity of the phase interpolator that has a higher requirement of phase modulation (e.g., the period between each phase rotation is measured in picoseconds).

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A control method, adapted to a phase interpolator configured to generate an output signal based on a current distribution ratio, the control method comprising:
   selecting a first input pair and a second input pair from the phase interpolator;
   sequentially switching a plurality of currents associated with the current distribution ratio from flowing through the first input pair to flowing through the second input pair, in order to adjust a phase of the output signal to correspond to a first phase interval; and
   after all of the plurality of currents flow through to the second input pair, selecting the second input pair and a third input pair from the phase interpolator, and adjusting the current distribution ratio to correspond the phase of the output signal to a second phase interval, wherein the first phase interval and the second phase interval are continuous,
   wherein selecting the first input pair and the second input pair comprises:
   turning on a first switch to select the first input pair, wherein the first switch is coupled between the first input pair and a current source circuit configured to generate the plurality of currents; and
   turning on a second switch to select the second input pair, wherein the second switch is coupled between the second input pair and the current source circuit,
   wherein both of the first input pair and the second input pair are configured to generate the output signal in response to a first clock signal and a second clock signal, and the first clock signal and the second clock signal are configured to define the first phase interval.

2. The control method of claim 1, wherein selecting the second input pair and the third input pair comprises:
   after the plurality of currents flow through the second input pair, turning off the first switch and turning on a third switch, in order to select the third input pair, wherein the third switch is coupled between the third input pair and the current source circuit, wherein both of the second input pair and the third input pair are configured to generate the output signal in response to the second clock signal and a third clock signal, and the second clock signal and the third clock signal are configured to define the second phase interval; and after the third switch is turned on, sequentially switching the plurality of currents to flow through the third input pair, in order to correspond the phase of the output signal to the second phase interval.

3. The control method of claim 1, wherein switching the plurality of currents comprises:

switching a plurality of signal values of a switching signal according to a first switching step size, in order to sequentially turn on a plurality of switches, wherein the plurality of switches are coupled between a current source circuit and three of the first input pair, the second input pair, and the third input pair, and the current source circuit is configured to generate the plurality of currents.

4. The control method of claim 3, further comprising:

switching the signal values in batches according to a second switching step size, wherein the second switching step size is less than the first switching step size.

5. The control method of claim 3, wherein the first switching step size is a quantity of a digit code that is transited in the signal values at each switching.

6. The control method of claim 5, wherein the digital code is a thermometer code.

7. The control method of claim 3, wherein the plurality of switches are configured to determine the current distribution ratio.

8. A phase adjustment circuit, comprising:

a phase interpolator configured to generate an output signal based on a current distribution ratio, the phase interpolator comprising a plurality of input pairs; and a phase rotator configured to select a first input pair and a second input pair from the plurality of input pairs, wherein the phase rotator is further configured to sequentially switch a plurality of currents, which are associated with the current distribution ratio, from flowing through the first input pair to flowing through the second input pair, in order to correspond a phase of the output signal to a first phase interval, wherein after the plurality of currents flow through the second input pair, the phase rotator is further configured to select the second input pair and a third input pair from the plurality of input pairs, and to adjust the current distribution ratio to correspond the phase of the output signal to a second phase interval, wherein the first phase interval and the second phase interval are continuous, wherein the phase interpolator comprises:

a current source circuit configured to generate the plurality of currents; and a plurality of first switches coupled between the plurality of input pairs and the current source circuit, wherein each of the plurality of first switches is configured to be turned on according a corresponding one of a plurality of selection signals, and the phase rotator is further configured to output the plurality of selection signals.

9. The phase adjustment circuit of claim 8, wherein the phase rotator is further configured to output a first selection signal and a second selection signal of the plurality of selection signals to turn on a first switch and a second switch of the plurality of first switches, in order to select the first input pair and the second input pair.

10. The phase adjustment circuit of claim 9, wherein after the plurality of currents flow through the second input pair, the phase rotator is further configured to output a third selection signal of the plurality of selection signals to turn on a third switch of the plurality of first switches, in order to select the third input pair.

11. The phase adjustment circuit of claim 8, wherein the phase interpolator further comprises:

a plurality of second switches coupled between the plurality of first switches and the current source circuit, and configured to be turned on according to a plurality of signal values of a switching signal, wherein the phase rotator is further configured to generate the switching signal and to switch the plurality of signal values according to a first switching step size, in order to sequentially switch the plurality of currents.

12. The phase adjustment circuit of claim 11, wherein the phase rotator is further configured to switch the plurality of signal values in batches according to a second switching step size, wherein the second switching step size is less than the first switching step size.

13. The phase adjustment circuit of claim 8, wherein both of the first input pair and the second input pair are configured to generate the output signal in response to a first clock signal and a second clock signal, and the first clock signal and the second clock signal are configured to define the first phase interval.

14. The phase adjustment circuit of claim 13, wherein both of the second input pair and the third input pair are configured to generate the output signal in response to the second clock signal and a third clock signal, and the second clock signal and the third clock signal are configured to define the second phase interval.

15. A measurement method, comprising:

switching a current distribution ratio of a phase interpolator back and forth between an initial ratio and a first ratio, in order to generate a first jitter signal component, wherein the phase interpolator is configured to determine a phase of an output signal based on the current distribution ratio;

switching the current distribution ratio back and forth between the initial ratio and a second ratio, in order to generate a second jitter signal component;

measuring the output signal, in order to analyze a first total energy of phase noises, which is associated with the first jitter signal component, and a second total energy of phase noises, which is associated with the second jitter signal component, in the output signal; and determining whether a change of the phase is monotonic based on the first total energy of phase noises and the second total energy of phase noises.

16. The measurement method of claim 15, wherein generating the first jitter signal component comprises:

switching a plurality of signal values of a switching signal back and forth between a plurality of initial values and a plurality of first signal values, in order to alternately turning on at least corresponding one of a plurality of switches, wherein the plurality of initial values correspond to the initial ratio, the plurality of first signal values correspond to the first ratio, and the plurality of switches are configured to be selectively turned on according to the plurality of signal values, in order to determine the current distribution ratio.

17. The measurement method of claim 15, wherein the phase interpolator is configured to generate the output signal based on the current distribution ratio and a plurality of clock signals, the plurality of clock signals are configured to define a plurality of phase intervals, and the measurement method further comprises:
  switching a plurality of selection signals, in order to correspond the output signal to at least one of the plurality of phase intervals,
  wherein the first jitter signal component corresponds to one of the phase intervals, and the second jitter signal component corresponds to two of the phase intervals.

18. The measurement method of claim 15, wherein on condition that the second ratio is greater than the first ratio, and the second total energy of phase noises is greater than the first total energy of phase noises, the change of the phase of the output signals is determined to be monotonic.

* * * * *